(12) United States Patent
Van Bael et al.

(10) Patent No.: US 11,481,989 B2
(45) Date of Patent: Oct. 25, 2022

(54) METHOD OF AND SYSTEM FOR GENERATING AND VIEWING A 3D VISUALIZATION OF AN OBJECT HAVING PRINTED FEATURES

(71) Applicant: ESKO Software BVBA, Ghent (BE)

(72) Inventors: Kristiaan K. A. Van Bael, Sint-Laureins (BE); Hans Dewitte, Ghent (BE); Paul J. J. Boonen, Ghent (BE)

(73) Assignee: Esko Software BV, Ghent (BE)

( * ) Notice: Subject to any disclaimer, the term of this patent is extended or adjusted under 35 U.S.C. 154(b) by 0 days.

(21) Appl. No.: 17/251,280

(22) PCT Filed: Apr. 14, 2020

(86) PCT No.: PCT/EP2020/060398
§ 371 (c)(1),
(2) Date: Dec. 11, 2020

(87) PCT Pub. No.: WO2020/208254
PCT Pub. Date: Oct. 15, 2020

(65) Prior Publication Data
US 2022/0020223 A1 Jan. 20, 2022

Related U.S. Application Data

(60) Provisional application No. 62/833,203, filed on Apr. 12, 2019.

(51) Int. Cl.
*G06T 19/20* (2011.01)
*G06F 30/10* (2020.01)
*G06T 11/00* (2006.01)
*G06T 15/04* (2011.01)

(52) U.S. Cl.
CPC .............. *G06T 19/20* (2013.01); *G06F 30/10* (2020.01); *G06T 11/001* (2013.01); *G06T 15/04* (2013.01); *G06T 2200/24* (2013.01); *G06T 2219/2004* (2013.01); *G06T 2219/2012* (2013.01); *G06T 2219/2021* (2013.01)

(58) Field of Classification Search
None
See application file for complete search history.

(56) References Cited

U.S. PATENT DOCUMENTS 7,154,505 B2   12/2006   Coulthard
2006/0098023 A1   5/2006   Coulthard
(Continued)

FOREIGN PATENT DOCUMENTS

WO    2019040398 A1    2/2019
WO    WO-2019126976 A1 *  7/2019    .............. G06T 15/00

OTHER PUBLICATIONS

International Standard, ISO 19593-1, Graphic technology—Use of PDF to associate processing steps and content data, 2018, 22 pages.
(Continued)

*Primary Examiner* — Sultana M Zalalee
(74) *Attorney, Agent, or Firm* — RatnerPrestia (57) ABSTRACT

A computer-implemented method for visualizing printed graphics applied to at least one defined printing area or part of a three dimensional (3D) structure is described.

29 Claims, 5 Drawing Sheets

(56) References Cited

U.S. PATENT DOCUMENTS

| | | | |
|---|---|---|---|
| 2006/0192996 A1* | 8/2006 | Yamamoto | G06F 3/1205 |
| | | | 358/1.15 |
| 2007/0076082 A1* | 4/2007 | Cook | B41J 3/36 |
| | | | 347/109 |
| 2007/0083383 A1* | 4/2007 | Van Bael | G06T 11/001 |
| | | | 715/772 |
| 2007/0195081 A1* | 8/2007 | Fischer | G06T 11/60 |
| | | | 707/999.001 |
| 2009/0189894 A1* | 7/2009 | Petrov | G06T 19/00 |
| | | | 345/419 |
| 2013/0278600 A1* | 10/2013 | Christensen | G06T 19/20 |
| | | | 345/420 |
| 2017/0041296 A1* | 2/2017 | Ford | G06F 16/951 |
| 2017/0124770 A1* | 5/2017 | Vats | G06F 3/167 |
| 2017/0352194 A1* | 12/2017 | Sculli | G06T 19/20 |
| 2017/0372511 A1 | 12/2017 | Wilensky | |
| 2018/0033193 A1 | 2/2018 | Goel et al. | |
| 2018/0067229 A1* | 3/2018 | Li | G01V 99/005 |
| 2019/0172161 A1* | 6/2019 | Conboy | B27N 9/00 |
| 2020/0005531 A1* | 1/2020 | Jiang | G06T 1/60 |
| 2020/0210599 A1* | 7/2020 | Akers | H04L 51/02 |
| 2020/0293185 A1* | 9/2020 | Shedigumme | G06F 21/31 |

OTHER PUBLICATIONS

International Preliminary Report on Patentability and Written Opinion for International Application No. PCT/EP2020/060398, dated Sep. 28, 2021, 13 pages.

International Search Report and Written Opinion for International Application No. PCT/EP2021/078447, dated Jan. 20, 2022, 24 pages.

Anonymous: "How to Composite 2D and 3D Objects and Effects", Adobe Dimension Tutorials, Oct. 18, 2017, 12 pages, XP055933284, Retrieved from the Internet: URL:https://helpx.adobe.com/dimension/how--to/apply-2d-vector-art-to3d.html [retrieved on Jun. 20, 2022].

Adobe Creative Cloud: "Use Adobe Dimension CC to Add Logos and Graphics to a Design—Adobe Creative Cloud", Nov. 2, 2018, 2 pages, XP055933285, Retrieved from the Internet: URL:https://youtube.com/watch?v=pJOQZf61xls.

European Communication for European Application No. 20 719 974.6, dated Jul. 7, 2022, 12 pages.

* cited by examiner

METHOD OF AND SYSTEM FOR GENERATING AND VIEWING A 3D VISUALIZATION OF AN OBJECT HAVING PRINTED FEATURES

CROSS-REFERENCE TO RELATED APPLICATIONS

This patent application is a U.S. National Phase Patent Application of PCT Application No. PCT/EP2020/060398, filed Apr. 14, 2020, which claims priority to U.S. Provisional Patent Application Ser. No. 62/833,203, filed Apr. 12, 2019, incorporated herein by reference in its entirety.

BACKGROUND OF THE INVENTION

Packaging production processes increasingly use 3D visualization as a way to communicate how a proposed packaging design may look once it is produced. Such visualization is used in both the selection process of, for example, substrates, geometry, print process, print ink, print finish, as well as for communication to, e.g., sales channels (provide renderings for e-commerce, presentations, video production).

Applicant is the owner of U.S. Pat. No. 7,154,505, titled "METHOD OF AND APPARATUS FOR GENERATING A REPRESENTATION OF AN OBJECT," incorporated herein by reference in its entirety, which describes a computer aided design and visualization software package capable of modeling real world operations that can be applied to a substrate to provide a realistic representation of the actual result of applying those operations in the real world. Other methods and apparatus for visualizing the rendering of digital images on a substrate are also known in the art, such as for example, as described in Published U.S. Patent Application Publication No. US20170372511A1, also incorporated herein by reference.

The aim of a typical 3D visualization process is to create a representation as accurate as possible with minimal effort. Accurate visualization requires reproduction of qualities of the printing and finishing process that go beyond the reproduction of graphics and colors. For example, aspects such as gloss, relief, and transparency give a 3D visualization a realistic look. Although rendering technology is readily available to display these optical effects, it requires great effort and skill to convert the production data into a format that is suitable for these rendering solutions. Therefore, the effort to create such realistic images is traditionally high. 3D structure and 2D graphic design objects are typically provided to a professional studio to create a 3D visualization using professional software (such as AutoDesk 3DS Max). This is a costly and time consuming operation. It limits the amount of trials and "what-if" scenarios affordable within the budget of the project.

SUMMARY OF THE INVENTION

One aspect of the invention comprises a computer-implemented method for visualizing printed graphics applied to at least one defined printing area or part of a three dimensional (3D) structure. The method comprises providing a visualizer web application that is remotely accessible via a global communication network by a user operating a local application in communication with the visualizer web application, the visualizer web application having a user interface for specifying one or more parameters to be accepted for execution by a visualization rendering processor. The web application accepts an input comprising machine-readable instructions for rendering the 3D structure and the at least one defined printing area or part, at least one two-dimensional (2D) graphic description, and an operation stack defining at least one operation corresponding to each of the plurality of separations. The 2D graphic description comprises a plurality of separations, each separation corresponding to a processing step, and is assigned to the at least one defined printing area or part in the 3D structure. Computer readable information corresponding to the at least one defined printing area or part, the at least one 2D graphic description, and the operation stack, is sent to the visualization rendering processor from the visualizer web application. The visualization rendering processor then calculates computer readable information corresponding to a set of textures including color and at least one other appearance property, by applying the 2D graphic description in accordance with the operation stack. The computer readable information is sent to the visualizer web application, which provides computer readable instructions for displaying on the local application of the user a graphical image corresponding to the 3D structure with the calculated set of textures. The visualization rendering processor may be provided as one of a plurality of containers administered by a container orchestrator. Accepting the operation stack may comprise selecting an operation profile and generating the operation stack according to the rules defined in the Operation Profile.

The computer readable instructions for displaying the graphical image corresponding to the 3D structure with the calculated set of textures may be stored. Accepting the 3D structure may comprise generating the 3D structure based upon user input. In some embodiments, the 3D structure may be a flat sheet, a cylinder, a cone, or an object of revolution. An exemplary flat sheet may have at least one die cut line and/or at least one hole. The 2D graphics may be applied to an outside and an inside, or a front and back, of a 3D structure. The 2D graphics may be geometrically aligned to the print area by top, left, bottom, right or center alignment, or by fitting a shape in the print area with a cut shape in the 2D graphics. The 2D graphics may be aligned to the print area using inputs received from an interactive alignment tool provided by the web visualizer application user interface. Accepting the 2D graphic description and/or accepting the 3D structure may comprise accepting information from a digital asset management system.

The web visualizer application may provide interactive tools that allow a user to manipulate one or both of a disposition of the 3D structure and an environment surrounding the 3D structure, such as modifying a lighting effect of the environment on the 3D structure, modifying a viewing angle of the 3D structure, or moving one or more movable components. Interactive shape creation tools may also be provided via the visualizer web application user interface.

Accepting the operation stack may comprise accepting at least two alternative operation stacks based upon user input. Such embodiments may comprise providing a first set of the computer readable instructions for displaying the graphical image corresponding to the 3D structure with a first alternative calculated set of textures, providing a second set of the computer readable instructions for displaying the graphical image corresponding to the 3D structure with a second alternative calculated set of textures, and providing computer readable instructions for displaying the 3D structure with the first alternative and the 3D structure with the second alternative for viewing simultaneously.

Bulk rendering embodiments may include identifying a group of 2D graphic descriptions associated with a same defined printing area or part in the 3D structure, each member of the group having an identical operation stack corresponding to the corresponding plurality of separations. In such embodiments, the calculating step comprises calculating in bulk the modified 3D structure corresponding to each member of the group.

The local application in communication with the visualizer web application comprises a web application running on a mobile device or a web application running on a browser. The modified 3D structure may be selected for use in a workflow, in which case the method includes forwarding information corresponding to the selected modified 3D structure for use in downstream steps of the workflow.

Another aspect of the invention comprises a system for visualizing printed graphics applied to at least one defined printing area or part of a three dimensional (3D) structure. The system comprises at least one computer processor accessible via a global communication network and programmed with computer readable instructions for providing a visualization rendering processor and a visualizer web application remotely accessible from a local application in communication with the visualizer web application. The visualizer web application has a user interface for specifying one or more parameters to be accepted for execution by the visualization rendering processor. The visualizer web application is programmed with instructions for accepting in the web application machine readable instructions for rendering the 3D structure with the at least one defined printing area or part, at least one two-dimensional (2D) graphic description comprising a plurality of separations each corresponding to a processing step, and an operation stack defining at least one operation corresponding to each of the plurality of separations. The visualizer web application is further programmed to assign the 2D graphic description to the at least one printing area or part in the 3D structure. The visualizer web application is further programmed to send computer readable information corresponding to the 3D structure, the at least one defined printing area or part, the at least one 2D graphic description, and the operation stack, to the visualization rendering processor, and to provide computer readable instructions for displaying on a local application of a user a graphical image corresponding to the 3D structure with a set of textures, including color and at least one other appearance property, calculated by the visualization rendering processor. The visualization rendering processor is programmed with instructions for calculating computer readable information corresponding to the set of textures by applying the 2D graphic description in accordance with the operation stack and for sending the calculated set of textures to the visualizer web application.

The system may further comprise at least one device having a display and a resident application comprising computer readable instructions for communicating over the global communication network with the at least one computer processor comprising the visualization rendering processor and the visualizer web application. The at least one device may be configured to display the 3D structure with the calculated set of textures on the display.

Yet another aspect of the invention comprises a computer-implemented method for visualizing printed graphics applied to at least one defined printing area or part of a three dimensional (3D) structure. The method comprises providing a local application configured for communication with a user interface of a remotely accessible visualizer web application via a global communication network. The visualizer web application user interface is configured to specify one or more parameters to be accepted for execution by a visualization rendering processor. The local application is configured to enable the user to specify to the web application (a) machine readable instructions for rendering the 3D structure with the at least one defined printing area or part, (b) at least one two-dimensional (2D) graphic description and assign it to the at least one printing area or part in the 3D structure, the at least one 2D graphic description comprising a plurality of separations, each separation corresponding to a processing step, and (c) an operation stack defining at least one operation corresponding to each of the plurality of separations. The local application is also configured to receive from the web application computer readable instructions for displaying a graphical image corresponding to the 3D structure with a set of textures calculated by the visualization rendering processor applying the 2D graphic description in accordance with the operation stack.

Still another aspect of the invention includes non-transitory computer-readable media comprising computer-readable instructions for visualizing printed graphics applied to at least one defined print area of a three dimensional (3D) structure. The instructions are programmed to provide a visualizer web application remotely accessible via a global communication network via a user operating a local application in communication with the visualizer web application. The visualizer web application has a user interface for specifying one or more parameters to be accepted for execution by a visualization rendering processor. The visualizer web application is programmed to accept (a) machine readable instructions for rendering the 3D structure with the at least one defined printing area or part, (b) at least one two-dimensional (2D) graphic description comprising a plurality of separations each corresponding to a print processing step, and (c) an operation stack defining at least one operation corresponding to each of the plurality of separations. The visualizer web application is also programmed to assign the 2D graphic description to the at least one printing area or part in the 3D structure, to send computer readable information corresponding to the 3D structure, the at least one defined printing area or part, the at least one 2D graphic description, and the operation stack, to the visualization rendering processor from the visualizer web application. The visualizer web application is also programmed to receive computer readable information corresponding to the 3D structure with a set of textures calculated by the visualization rendering processor and provide computer readable instructions for displaying a graphical image corresponding to the 3D structure with the calculated set of textures on the local application. The visualization rendering processor is configured to calculate the set of textures by applying the 2D graphic description in accordance with the operation stack and to send the calculated set of textures to the visualizer web application.

Still another aspect of the invention comprises non-transitory computer-readable media comprising computer-readable instructions for visualizing printed graphics applied to at least one defined print area of a three dimensional (3D) structure. The instructions are programmed to provide a local application configured for communication with a user interface of a remotely accessible visualizer web application via a global communication network, the visualizer web application user interface configured to specify one or more parameters to be accepted for execution by a visualization rendering processor. The local application is configured to enable the user to specify to the web application (a) machine readable instructions for rendering the 3D structure with the at least one defined printing area or part, (b) at least one 2D graphic description comprising a plurality of separations each corresponding to a print processing step, and (c) an operation stack defining at least one operation corresponding to each of the plurality of separations. The 2D graphic description is assigned to the at least one printing area or part in the 3D structure.

The local application is further configured receive from the web application, computer readable instructions for displaying a graphical image corresponding to the 3D structure with a set of textures calculated by the visualization rendering processor applying the 2D graphic description in accordance with the operation stack.

DETAILED DESCRIPTION OF THE INVENTION

Glossary

Various terms may be used throughout this description are intended to have the following meanings.

Accepting: (e.g. "accepting X") any way of receiving x and making it available to a system, including without limitation, receiving from a database, uploaded as a file, defined/drawn in a user interface, and the like.

Digital Asset Management System: hardware and software configured to store, categorize and retrieve digital files (2D and 3D), with optional features such as version control, access control, roles, rights management and full text searching.

Operation Stack: A digital description of an appearance of a substrate and a list of operations each associated with a separation. Each operation describes the incremental changes to the appearance, thereby mimicking physical surface processing operation such as printing and finishing. The appearance definition includes color and at least one other surface characteristic (such as gloss, 3D relief, transparency, and the like), as further described in U.S. Pat. No. 7,154,505, referenced above.

Operation Profile: A set of rules for building an operation stack, given a 2D graphics file. The profile defines a substrate, and a mapping table of separation names to the appropriate operations. The profile can also indicate which separations do not need to be mapped (and which therefore will not be visible).

Specifying: (e.g. "specifying X") any way of supplying x to a system, including without limitation, selecting from a database, uploading as a file, defining/drawing in a user interface, and the like.

Separation: A part of a graphic description containing the instructions to execute one process step in the reproduction of the graphic. Separations are most traditionally linked to the process step of printing ink on a substrate with a printing press having one printing tower per ink, and the instructions are traditionally a way to determine the amount of ink to transfer on each position. However, the term "separation" in the current description is intended to broadly relate to any process step, including (non-exhaustive) instructions for varnishing, embossing, cutting, creasing, folding, gluing, and the like. Also, the instructions may be based on a 2D geometrical description but can be created in any other way that allows sufficient description of the step for its production.

Web application: an application running on a client computer (e.g. Apple Macintosh, Windows-based PCs, Linux-based computers) or mobile device (e.g. Apple iPhone or Android devices) connecting to a server or service running on a different (set of) host computers over the internet and using that server as its main content source and destination (with typically very little local storage, e.g. only cookies). The web application can run in a web browser, such as, e.g., Google Chrome, but can also run as an independent application that takes over the functionality of the web browser (e.g. by implementing the HTTP protocol and Web-GL rendering via libraries).

Visualization rendering processor: computer program (or computer running the computer program) which accepts at least one graphic 2D description and at least one Operation Stack and generates instructions for a standard 3D rendering engine (e.g. Web-GL running in a web browser and using the client computer's GPU) allowing that rendering engine to display the 2D graphics on any 3D structure.

DETAILED DESCRIPTION

Aspects of the invention involve creating a 3D visualization in a web page based on accepting a 3D structure (potentially already having some texture) with printable areas, accepting one or more 2D graphic descriptions (PDF, Images), and accepting information about how the substrate (s) and process steps influence the light reflection/diffusion/diffraction. From all of the foregoing information, a 3D visualization is calculated that can be shown optimally in a web page. The entire process is expected to take less than a minute (in most cases<10 seconds), making the application interactive, and accessible to anyone that either has access to the necessary assets (artwork, structure, operation profile) or has such assets available for upload.

Other aspects of the invention provide workflow capabilities around the visualization process, including a distribution of responsibility between people deciding on the various inputs and processing steps, storing such decisions, and using them in the further visualization, in this way providing the decision makers and other stakeholders with the visual consequences of their decisions.

Exemplary systems may be configured to accept and (optionally) store 3D structures (e.g. in the COLLADA format) which have (apart from the 3D geometric definition) also printable areas (areas of the structure where printed matter will appear). Typically these printable areas are areas which can accept either direct printing (e.g. using the dry offset printing process) or printed materials applied thereto (e.g. adhesively applied labels, a printed wrapper). The printable area can also be the entire surface of the 3D structure (as is the case with boxes and flexible bags, for example). Printable areas may include, for example, the outside and the inside of a container, or a front and back of a flat structure. Embodiments that are more complex may include a shrink-wrap applied around the structure (or part of the structure). Such structures may also be referred to as printable parts. The definition of the 3D object is configured for conversion of a 2D graphic (and its 2D coordinates) into the 3D coordinates corresponding to each of the 2D coordinates. Thus for each 2D (X,Y) coordinate of a graphic, there is a conversion to a place on the 3D surface (x',y',z') coordinate.

Exemplary systems may be further configured to accept and (optionally) store 2D graphics and may have a user interface (and some automation) to assign the 2D graphics to one or more printable areas. User interface and automation features are configured to align the 2D graphics to the assigned printable area. Such alignment includes setting the rotation (most typically in multiples of 90 degrees) and the alignment of a reference point. In this way, the cut area of a label will be aligned with (e.g. the center, top, left, bottom, or right of) the area where the label is expected to be stuck in the filling/label application machine. Similar alignment can be defined for other types of printable areas or printable parts.

Exemplary systems may be still further configured to accept an operation stack for each of the printable areas/parts. The operations in the stack are mapped to the separations of the 2D graphics via a mapping table. Population of the table is largely automatic (based on well-known typical names and a built-up historic mapping) but also may have an interactive portion that permits the end user to manually input information to help the mapping, if the automatic mapping is insufficiently accurate. Manually input information can further be stored in the cloud system by either updating the mapping table or by storing user preferences.

With the information as described above, a 3D representation is calculated in a scalable cloud environment. The output can be a device-independent 3D format (e.g. COLLADA), or a Web-GL description optimized for cloud/web-enabled viewing, or both. The end user is shown a "what-you-see-is-what-you-get" (WYSIWYG) image on a local browser screen where the user can spin, zoom, pan the 3D representation, change the lighting conditions and get an accurate representation of the packaging as it will come out of the packaging machinery and how it will look in the market.

Exemplary systems may optionally provide user and role management with business logic, allowing a determination of who can make design decisions and constrain further users to the decisions previously made by others. Additional business logic may show processing consequences and cost consequences of said decisions along with the visualization.

Referring now to the figures, an exemplary system is now described with reference to the schematic diagram depicted of FIG. 1.

Figure 1:
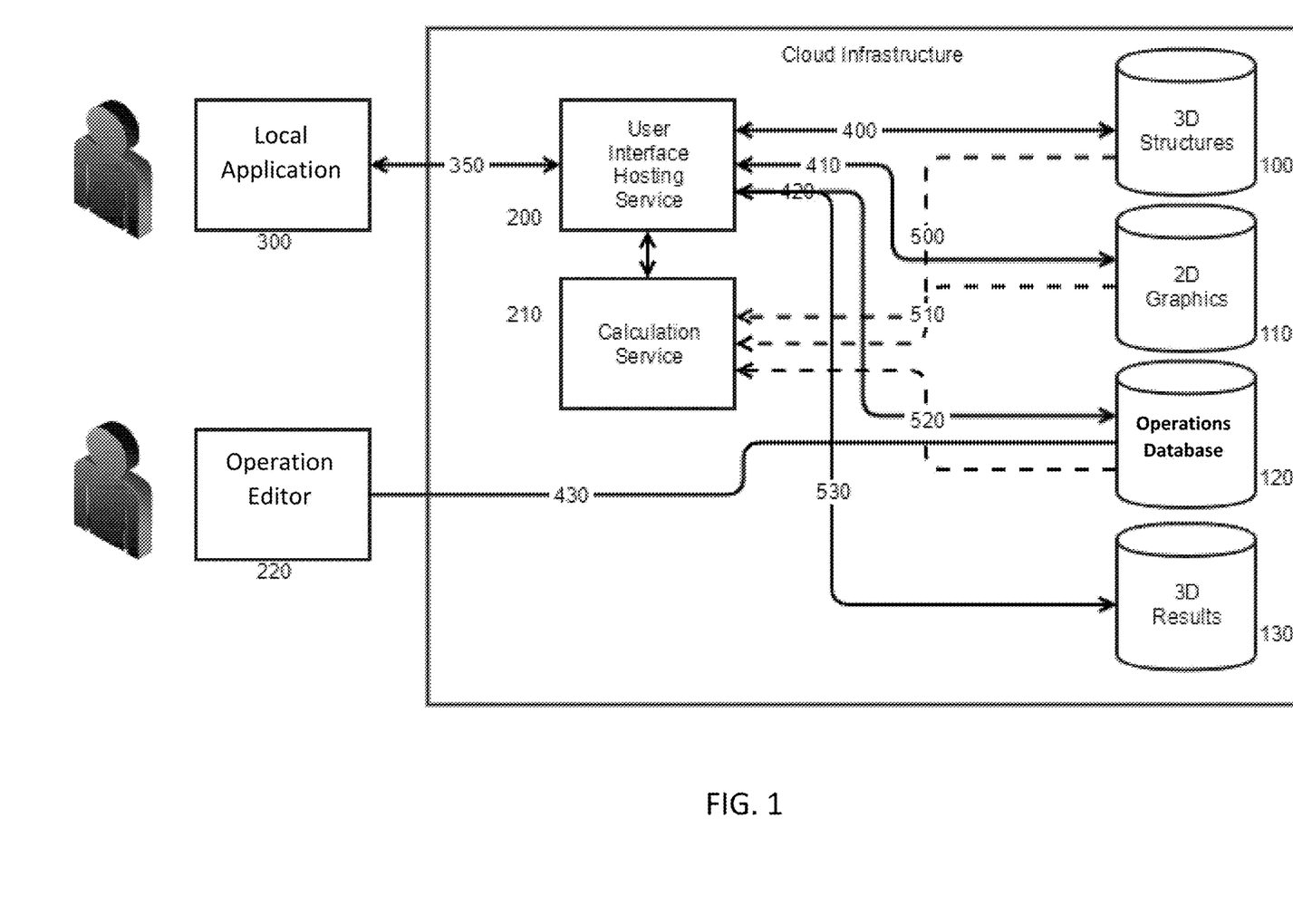
FIG. 1 is a schematic diagram depicting an exemplary system for visualization.
Figure 3:
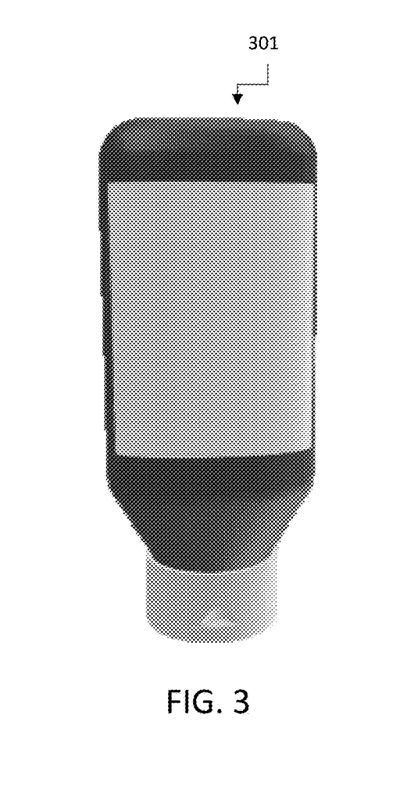
FIG. 3 is an exemplary rendering of a three-dimensional structure showing an exemplary print area.

In the exemplary system depicted in FIG. 1, 3D Structures Database 100 comprises a database comprising machine-readable instructions for rendering three-dimensional (3D) structures with printable areas/parts. In one form, this database may comprise a storage folder with Collada files. As is known to those of skill in the art, COLLADA stands for COLLAborative Design Activity and is an interchange file format for interactive 3D applications managed by the nonprofit technology consortium, the Khronos Group. COLLADA has been adopted by ISO as a publicly available specification: ISO/PAS 17506, incorporated herein by reference. In a more complex form, an asset management system may be used. An exemplary asset management system stores not only the COLLADA file, but also metadata categorizing the 3D structure, for easy retrieval. The asset management system can further constrain the usage (or even finding) of 3D structures based on business logic. The database can be distributed, including a system which collects or indexes 3D structures from different sources (e.g. multiple asset management systems, multiple cloud storage folders), including a capability to publish 3D structures to different companies. Thus, for example, the machine-readable language for generating the 3D structure 301 depicted in FIG. 3 may be originally generated by a container manufacturer, but may be shared with companies who purchase containers from the supplier as packaging for their goods (e.g. condiments such as ketchup, mustard, relish, etc.) as well as with package designers who design the labels for such packaging. The double-sided arrow 400 between User Interface Hosting Service 200 and 3D Structures Database is intended to show that structures stored in the database may be shared with the User Interface Hosting Service 200, and structures defined within or uploaded via the User Interface Hosting Service 200 may be stored in the 3D Structures Database.

In the exemplary system, 2D Graphics Database 110 comprises a database of 2D graphic descriptions. Exemplary 2D graphic descriptions may comprise files such as Portable Document Format (PDF) or Adobe Illustrator (AI) files. The invention is not limited to any particular type (e.g. vector or bitmap) or format (e.g. PDF, AI) of file. Any 2D graphic description that is machine-readable is within the scope of the invention. The 2D graphics database can be simple (e.g. cloud storage folders) or advanced (e.g. an asset management system) and/or distributed. Double-sided arrow 410 between User Interface Hosting Service 200 and 2D Graphics Database 110 is intended to show that graphics stored in the database may be shared with the User Interface Hosting Service 200, and graphics defined within or uploaded via the User Interface Hosting Service 200 may be stored in the 2D Graphics Database 110.

Operations Database 120 comprises a database of operations and operation profiles, which may include a flat folder or folder structure, an asset management system, or a relational database in which multiple operations and operation profiles may share certain common modules or components. Double-sided arrow 420 between User Interface Hosting Service 200 and Operations Database 120 is intended to show that operations and operation profiles stored in the database may be shared with the User Interface Hosting Service 200, and profiles defined within or uploaded via the User Interface Hosting Service 200 may be stored in the Operations Database 120.

User Interface Hosting Service 200 (also referred to herein as the "3D Visualizer Web Application" or the "visualizer web application"), which may comprise computer hardware such as a computer server having inputs, outputs, and a processor configured to execute machine-readable commands, hosts a user interface and accepts service requests, such as received over a communication network using Hypertext Transfer Protocol (HTTP). Service 200 may be implemented on top of a web server (e.g. using Tomcat® software available from Apache Software Foundation of Wakefield, Mass.,) which can service HTTP requests and respond directly (e.g. via requests for user interface components) or forward the call to a more specialized service (such as Calculation service 210).

Calculation Service 210 (also referred to herein as a "visualization rendering processor"), which may reside on the same computer hardware device as Hosting Service 200 or on a different hardware module, is configured to receive service requests as an input, retrieve at least one 2D graphics description from the 2D Graphics Database 110 via connection 510, and an operation stack with operations from Operations Database 120 via connection 520, and then calculate a 3D description in response to the request. The 3D description may be returned to the sender of the service request (e.g. the User Interface Hosting Service 200) or made available at a location determined by the service request, or agreed upon in advance, from which the requesting service or the user can pick up the result of the calculation. In one embodiment, the calculation service only returns the texture and shader information as 3D description (and the local application will combine it with the geometry of the chosen 3D structure). In another embodiment, the calculation service also receives the chosen 3D geometry and returns the full 3D description consisting of both geometry and textures.

Local application 300 may comprise an application or a web browser installed on a desktop computer or mobile device and configured for communication over a communication network (e.g. the Internet or World Wide Web). A user enters the online address (e.g. a Universal Record Locator (URL) from which the User Interface Hosting Service 200 is accessible) or the local application automatically connects to its cloud-based counterpart, and the user can interact with the application or browser to select 3D structures, 2D graphics, and an operation stack, and initiate a calculation via the connection to the hosting service 200. The browser or other application may comprise any set of software instructions resident on a local device configured to communicate with the User Interface Hosting Service via a global computer network 350. The instructions may reside on the local device as a removable application, such as for example available for download and storage on a tablet computer, or as a temporary set of instructions downloaded to the browser via connection to the hosting service 200.

Operation Editor 220 is an optional application (i.e. set of computer readable instructions), such as a conventional desktop application used by a specialist having a capability of defining new operations and operations profiles. The editor connects to the Operations Database 120 via connection 430 through which it can retrieve, store, specify, or edit operations and operations profiles. In one embodiment, the operations profile editor may be embedded in a module of the web application and operated from a web browser, in which case line 430 can be envisioned to run through hosting service 200 and, and in some cases, the operations profile editor may have all of the functions of local application 300.

Portions of the system as depicted in FIG. 1 may be deployed in a public cloud infrastructure, such as Amazon Web Services (AWS), but may also be installed in a conventional server environment on the premises of a service provider or in a data center, accessible via an online computer network (e.g. the Internet).

In one embodiment, storage for the computer readable instructions as described herein may be stored in cloud storage, such as AWS S3, the databases may be cloud databases such as AWS DynamoDB or RDS, and the calculation services may be scalable containers orchestrated by a container scheduler such as AWS ECS (with or without AWS Fargate).

Figure 2:
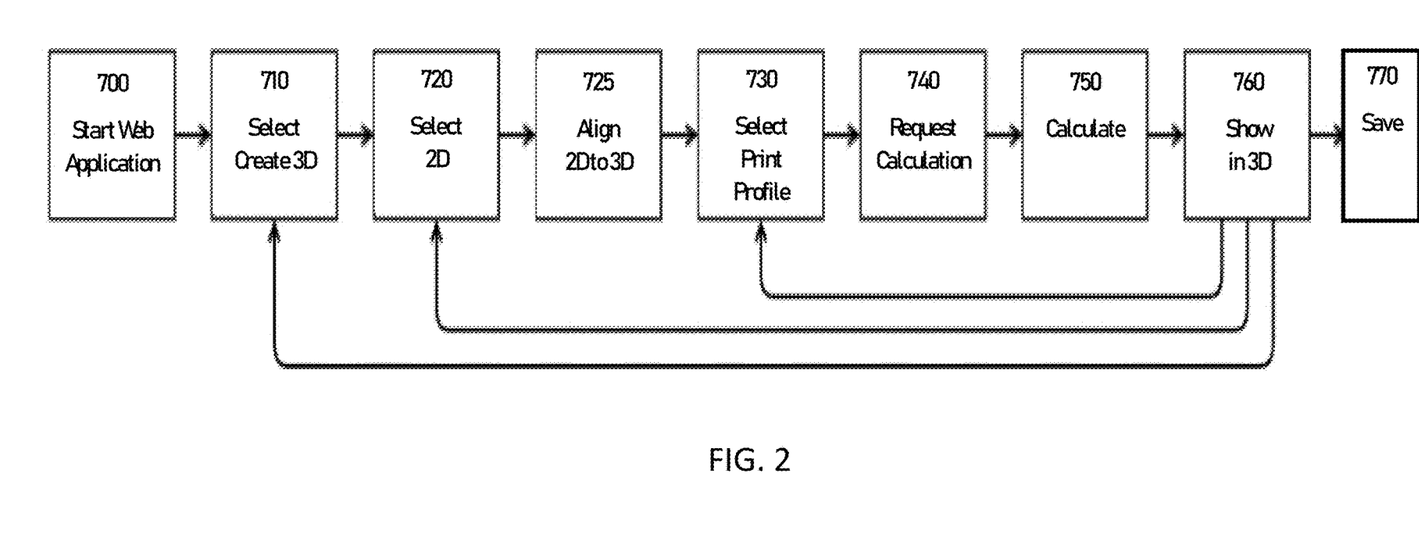
FIG. 2 is a flowchart representing an exemplary method for visualization.

Referring now to FIG. 2, an exemplary workflow may have following steps, which are not necessarily executed in the order as depicted or discussed herein. In step 700, a Web Application is started by a human user using Web Browser 300. In step 710, the user selects a 3D structure from 3D Structure Database 100 or uploads a desired structure. In step 720, the user uploads or selects 2D graphics from 2D Graphics Database. In step 725, the user aligns the 2D graphics to the 3D structure, which may be assisted by a default alignment or auto-alignment algorithm, alignment information found in the loaded files, and optionally with manual user input, as described herein. In step 730, the user selects an operations profile from the Operations Database 120, or uploads one. In step 740, recalculation of the 3D structure to include the information from the 2D Graphics and the Operations Profile is initiated, such as by the user, or automatically. In step 750, the system calculates the 3D structure and sends the calculated information back to the Web Browser 300. In step 760, the Web Browser 300 displays the 3D visualization, and permits manipulation of the rendered object on a display, such as zooming, panning, rotation of the object, and the like. The user can repeat the foregoing steps with different selections. After each calculation, in step 770, the user may save the calculated 3D visualization and its inputs, create and save still images (such as from different perspectives), and/or forward the information corresponding to the selected visualization for use in downstream steps in a holistic workflow (e.g. a packaging management workflow).

The Web Application

An exemplary web application is hosted by the Web Server 200 and accepts calls from the Web Browser 300. A first call to a starting address of the web application (e.g. a fixed URL) returns a web page providing the elements of a user interface. Exemplary user interface elements include elements configured to display and permit selection of choices from lists of 3D structures, 2D structures, and operations profiles. The lists may be shown permanently (e.g. via a folder browsing user interface) or upon request (e.g. by choosing a button or menu item labeled, for example, "Select 3D Structure"). Showing the list may include displaying on the user interface screen a name for each item on the list, a thumbnail, and optionally additional information (such as for the 3D structure, the number of printable parts, technical data (e.g. material), or business data (e.g. brand of the product for which this packaging was designed)). The user interface is also configured to show in a 3D viewing window the result of the calculation. This function may, for example, be loaded as Web-GL instructions. As is known in the art, WebGL (Web Graphics Library) is a JavaScript Application Programming Interface (API) for rendering interactive 2D and 3D graphics within any compatible web browser without the use of plug-ins. Web-GL software allows, for example, zooming, panning, and rotating the object. The user interface may provide 3D navigation tools, such as but not limited to zoom, pan, and translate commands. The user interface may be configured to provide scene elements, such as lighting, which may be controllable in any way known in the art (e.g. adding, removing or modifying individual light sources or selecting a lighting environment, such as a an HDR spherical image, and/or modifying the orientation of the lighting relative to the 3D object or the view). The user may be able to save results to a 3D Results Database 130, where those results are accessible by the user, by others, or by a limited group of others, depending upon preferences and settings. Preferably, the web application user interface also permits the user to download the results (including the 3D visualization and information describing the input parameters that generated that visualization) to the client workstation on which the web browser is running. The user interface also preferably permits the user to forward results to others as files, which files may be machine-readable for reproducing the visualization, or may be usable in a workflow for creating a real life product that confirms to the input parameters underlying the visualization. Double-sided arrow 530 between User Interface Hosting Service 200 and 3D Results Database 130 is intended to show that information stored in the database may be shared with the User Interface Hosting Service 200, and information defined within or uploaded via the User Interface Hosting Service 200 may be stored in the 3D Results Database 120.

The web application provides an interactive experience through which the user can combine 3D structure, 2D graphics and operations profiles to create a visualized 3D result. One embodiment may feature a wizard-style approach that walks the user through each of the selection steps one at a time. Business logic may be used for filtering the database to present a desired subset of graphics for the chosen 3D structure. Another embodiment may feature a 2D-graphic-centered approach, in which a 2D graphic is shown first, and then this 2D graphic is "augmented" to 3D. This approach may be especially well suited for situations in which the 3D structure has only a single graphic element or when the 3D structure is generated on-the-fly, as described herein later. Another exemplary embodiment may display a 3D structure, and permit the user to click on each printable area and see a 2D graphic selector of content filtered to be specific to the selected area. Preferably, the user can update the 3D preview at any time in the process.

When a 3D preview must be calculated (either because the user clicks on a request for a 3D preview, or because the application determines that all inputs have been entered, a call is sent to the Web Service 200 with information about the selected choices. The Web Server 200 then calls on the back-end services and returns a 3D representation of the structure combined with the graphics, as described herein. This returned 3D representation is received by the web browser and displayed in a Web-GL compatible HTML element.

When the user of the web application clicks on the Save button, the choices and optionally also the calculated result are stored in 3D Results Database 130 along with a unique identifier (i.e. a name for the file). The user can retrieve these results in a later session by selecting this result by name. Clearly, the storage of these results can use all storage and classification methods known in the art (e.g. an asset management system or a set of folders).

3D Structures

The 3D structures in database 100 are preferably in the COLLADA format. The 3D structure is preferably described as a triangle mesh (or another rendering-friendly 3D description) approximation of the actual 3D structure (e.g. a jar or glass bottle). The 3D structure includes one or more printable areas or printable parts. As used herein, the term "printable area" refers to an area of the 3D structure that is directly printed. A "printable part" is a geometric structure of its own applied to the base 3D structure. This way, a label can be stuck on a bottle. With a sense of abstraction, direct printing can still be seen as a printable part where the part itself is geometrically a part of the base 3D structure (e.g. a part that is kept flat in one direction or both directions to make printing on it possible) and has no thickness of its own and inherits the substrate from the original substrate. Doing this abstraction simplifies the rest of the application, as both cases can be treated identically. The 3D structure optionally includes a thumbnail allowing a user to recognize the structure when presented as part of a library of structures.

Metadata describing the structure, such as the name, intent and restrictions of each of the printable areas/parts, may be stored as part of the structure itself, or stored externally in the database.

The 3D definition also includes information for converting each of the printable parts' 2D graphic (and its 2D coordinates) into the 3D coordinates corresponding to each of the 2D coordinates. Thus, for each 2D (X,Y) coordinate of a graphic, there is a conversion to a place on the 3D surface (x',y',z' coordinates). In some embodiments, this conversion may be straightforward (e.g. printing 2D graphics on a flat surface). In other embodiments, the conversion may be advanced (e.g. printing 2D graphics on shrink foil, which is shrunk around a complex geometric structure like a fancy bottle or a head of broccoli).

The 3D structure may have multiple printable areas or parts, and the printable areas or parts may overlap. For convenience and for ease of reference, each area has a unique name.

The 3D structures may be created in any number of ways. One way is to use a desktop application 230, such as for example, Esko's Studio product range. The desktop application is configured to read the machine-readable description of the structure in a selected format and allows a professional user to import or define the base 3D structure as well as the printable parts. Another way is to use a 3D structure definition web application. This application may comprise a module embedded as a specialized area in Web Browser 300. After completing the work of creating the structure, the structure information is stored in the 3D Structures Database 100. Yet another way comprises creating the 3D structure on the fly without storing the structure in Database 300, and the structure as created is passed to the calculation service without prior storage. Such a method may be desirable for simple structures, such as a simple cylinder or other exemplary "on-the-fly geometries" as discussed herein later.

Creation of 3D structures is typically more complex work than using embodiments of the invention to create final representations of graphics applied to a structure using a pre-defined structure. This aligns with the business needs. In practice, graphics are changed far more frequently than structure. More detailed, flat structures (such as labels) are easier to change (both in graphics and in cutting shape) than changing rigid 3D structures (such as glass or plastic bottles). The frequency of changing 2D structures as compared to the frequency of changing 3D structures is between a factor 10 and 100. Reasons for this include the cost of creating new tooling for rigid structures and the cost of adapting filling machines when structures change. In addition, the intended marketing effects for selling products and communicating product information can typically be achieved readily by changing the 2D graphics.

2D Graphics and Operation Profiles

While any 2D graphic format may be accepted as input graphics in preferred embodiments, well-prepared graphics will lead to more accurate results with less effort. In a first embodiment, the graphics are well prepared and each of the processing steps is stored indisputably in the graphic description. Exemplary "well-prepared" graphics include a description of final printing as printing separations, one for each printing pass, in which the name of each separation uniquely corresponds to a known operation (ink, varnish, etc.) For example, standardized names such as Pantone® colors may be used, possibly in combination with an ink database. Non-printable separations or layers may be easy to recognize or are absent. Mechanical processes (embossing, foiling, cutting) are uniquely recognized in the graphics file. One way to do this is described in the ISO 19593-1:2018 standard, Graphic technology—Use of PDF to associate processing steps and content data—Part 1: Processing steps for packaging and labels, incorporated herein by reference.

In another embodiment, less well-prepared graphic files may be accepted and "up-worked" to the quality of the first embodiment. For example, non-printable inks may be recognized by maintaining a list of known names of non-printable inks. This list may be stored in a database (as operations profiles) and provided in the user interface in an editable table. Printing inks may be mapped by maintaining a list of possible names for each actual list. For example, a name mapping system may convert PMS123 automatically to Pantone Coated 123. Language converting tables may also be provided (e.g. mapping "noir" to "black"). A table of separations in the graphic may be provided in the user interface, with a proposed mapping to known processes and means for interactively determining how to map each of the separations. Each of these decisions may be stored inside or along with the 2D graphics in the 2D graphics database or elsewhere. For example, the same 2D graphics may be upworked differently for different visualizations. Once the upworking has been completed, the system can proceed as described above with respect to the first embodiment An example of a table that maps known non-printable inks to standardized processing steps is depicted below. On the left side are standardized names of print processing steps. On the right side are lists of "regular expressions." Accordingly, when a separation of the 2D graphic matches one of the regular expressions, it is recognized as a processing step with the corresponding standardized name and it is used as the same for the 3D calculation.

TABLE 1

| Operation | list of regular expressions |
|---|---|
| White | ".*white.*", ".*wit.*", ".*blanc.*" |
| Diecut | ".*die.*", ".*cut.*", ".*coupe.*", ".*stanze.*" |
| Gold | ".*gold.*" |

2D to 3D Alignment

An alignment step determines where the 2D graphics will be applied to the 3D structure. The 3D structure has predefined printable parts, such that in a first decision, each of the 2D graphics is assigned to one of the printable parts. In a less typical situation, the same 2D graphics may be applied multiple times to a different printable part, showing the same print on multiple places on the 3D structure (e.g. two identical labels applied to a bottle, which is not very common but is not excluded).

A user may make a 2D to 3D alignment selection from a table displaying the printable part in a first column and a dropdown with the available 2D graphics in a second column. Another interface may display the 3D structure and allow the user to select a printable part by clicking on the part visually, then selecting the 2D graphics. Yet another embodiment may permit the user to drag and drop graphics from a gallery of 2D parts over to the 3D printable area, analogous to putting a label or a shrink wrap over the 3D structure by hand.

The system may be configured to auto-align the 2D to the 3D printable part. In one embodiment, the unwarped/unfolded/unbended 2D shape of the 3D printable part has the identical geometry as the chosen 2D graphic, such that the system can put the 2D graphic exactly aligned on the 3D printable part. In this case, no human intervention is needed. In another embodiment, the 2D graphic may not fit identically, but includes stored alignment information (e.g. a reference point and a rotation). In such an embodiment, the system may be configured to correctly align automatically by applying corresponding well-known translation and rotation operations on the coordinates. In still another embodiment, no alignment information may be provided, but the shape of the printable part may be represented in the graphic as a contour (e.g. a separation named "cut" has the same contour as the shape of the printable part). In this instance, geometric operations may be automatically calculated to translate and rotate coordinates.

Further options may permit auto-centering the graphic (possibly after first deriving a surrounding rectangle or using one a PDF box). In yet another embodiment, the web application may have a manual alignment function that permits the user to grab the 2D graphic and shift it over the 3D printable area. The interactive function may further include snapping to a predefined setoff coordinates or using 2-point or 3-point alignment features.

When the user is satisfied with the alignment, the alignment may be saved so that the operation does not have to be redone later by the same or a different user.

Operation Stack

The operation stack is a description of the appearance of a substrate and a list of operations. Each operation describes the incremental changes to the appearance, thereby mimicking physical surface processing operations such as printing and finishing. The appearance definition includes color and at least one other surface characteristic (such as gloss, 3D relief, transparency, and the like), as is further described in U.S. Pat. No. 7,154,505, referenced above.

The Operation Stack typically mimics a physical process, such as for example, "printing with water-based inks on a flexo press on self-adhesive PVC labels." Each step in the stack represent a surface processing operation. These steps (also known as Operations) may include any or all of the following (which is a non-exhaustive list), each of which is explained in more detail in U.S. Pat. No. 7,154,505:

- identifying a base substrate
- printing with process and spot color inks, in which each ink is represented by a separation in the graphic file;
- printing with varnishes, which may be represented by a separations having a name containing "varnish" or a translation in a different language or inks marked as varnish as a processing step;
- applying foils (e.g. gold foil);
- embossing;
- cutting, which may be represented by separations named "cut" or something similar or translated; and
- creasing (and folding).

Although the operations are meant to mimic real print and finishing process steps, their purpose in this invention is to mimic their appearance to be used in a 3D rendering. Therefore, categories of different processes with a very similar appearance can be described by the same operation.

Each operation can be associated to a part of the 2D graphics to define where the operation is to be applied. Usually this part is a separation. But the graphics for the different operations may also be supplied as separate files, or identified by means of a layer or by ISO 19593-1:201). Other operations in the stack might not require a link to the artwork, as they are applied evenly across the entire surface (such as a lamination).

Operations Profiles

The association between the operations and the graphic separations can be done explicitly by the user in the user interface by letting the user choose the substrate and the operation for every separation in the artwork from the list of operations in the operations database.

But in another embodiment, the operation stack is composed with less user input, in which the user may only have to choose an operations profile per printable part from a list, and the operation stack is automatically generated based on properties of the 2D graphics.

An operations profile contains a set of rules for determining the operation stack (substrate and all other operations) based on properties of the 2D graphics, such as the names of the inks or the layers.

In one embodiment the user is presented the choice between a few operation profiles, describing popular generic substrates (e.g. uncoated paper, gloss coated paper, clear film, metallic film). All the other operations are automatically identified based on the names of the separations and the chosen substrate (as described in the operations profile). For example, the operations profile for the clear film substrate might associate a separation called "Gold" to a gold colored liquid ink, whereas the same separation can be mapped to a hot foil stamp in the "gloss coated paper" profile. This embodiment, of course, requires some degree of standardization in the structure of the 2D artwork files. The operation profiles also preferably include processing-sequence information to ensure that the operations are performed in a logical order (which may be important to get the correct rendered appearance).

In some embodiments, multiple operation stacks may be applied to the same 2D graphics, e.g. to represent that the graphic will undergo multiple different base processes. One use case may be printing first on a flexo press (e.g. for the primary branding and labeling) followed by additional printing on a digital press (e.g. for variable data, such as serial numbers, lot numbers, expiration dates, etc.). The user interface may therefore be configured to allow selecting for different processing steps in the chosen 2D graphic operation stack.

Description of the Calculation Service

Figure 6:
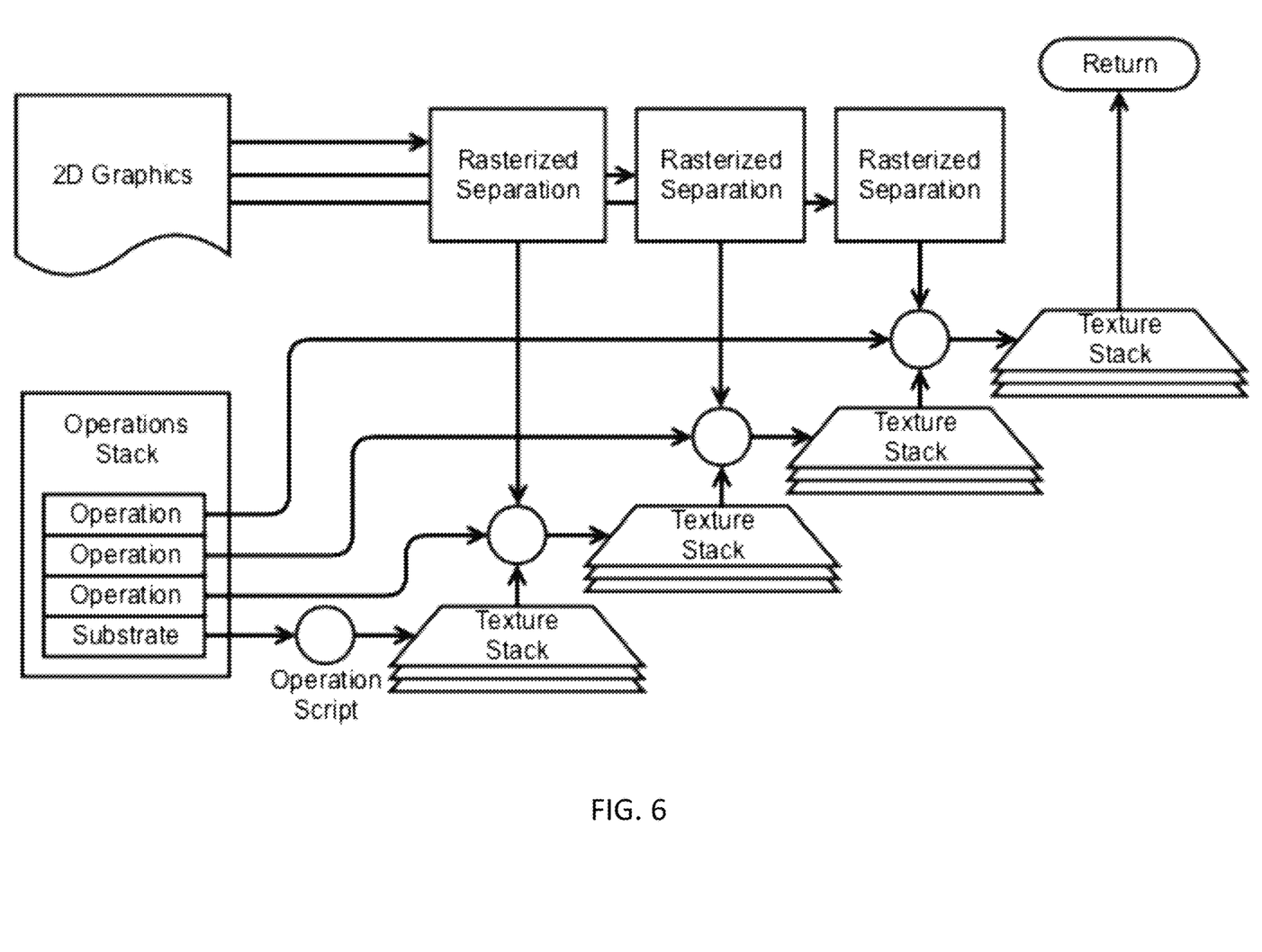
FIG. 6 depicts an exemplary visualization rendering processor.

The visualizer calculation processor (visualization rendering processor) interprets each of the printable parts, 2D graphics and operation stack associated therewith. Referring now to FIG. 6, the visualizer receives the 2D graphics comprising a plurality of separations, and for each separation, rasterizes the separation (i.e. to a pixel grid of a chosen resolution, indicating the intensity of the separation for each pixel).

Using the list of separations as an input, the corresponding pixel grids, and the operation stack, the service calculates a texture stack. The texture stack is a set of images that describes the different appearance aspects of a surface (e.g. color, transparency, gloss, haze, relief, and the like). Starting with the substrate as defined in the operation stack, each of the operations in the operations stack modifies the appearance, such as by an image processing script initializing or modifying the texture stack. Each operation describes an image processing script that takes the separation pixel grid as input and incrementally updates the texture stack. The separations are applied to the substrate in the sequence of operations. After applying all the operations, the final texture stack is returned to the request. In an exemplary embodiment, the mixture of these appearances may be calculated largely in accordance with the technology described in US Published Patent Application No. 20060098023A1, incorporated herein by reference. For each separation, appearance information is retrieved using one of the techniques described above with respect to 2D graphics, and applied to the previous texture stack, driven by the separation pixel grid as previously calculated. For separation pixels that have a 0 intensity, typically no change is made to the stack. For separation pixels that have 1 intensity, the appearance is mixed according to the technology described in US20060098023A1. For separation pixels with an intensity between 0 and 1, also known as "screened pixels", a screening appearance modifier is first applied. This may comprise applying the appearance of an ink only for a corresponding percentage, or may be based on a formula or look up table based on actual measurements performed for that printing ink on the same or a similar substrate. Other operations are applied in a similar way. For example, parts to be cut away from the 2D graphics are factored into the calculations. This step may be part of a separate service or may be performed prior to application of the operation stack. Then, the results calculated by this module are returned to the caller for further use. In some embodiments, the texture stack is first optimized for WebGL rendering before returning it to the caller. Optimizations may include converting from high dynamic range to low dynamic range, data compression, resampling (anti-aliasing), and the like.

The actual calculation is performed by calling a pool of cloud engines configured to read (optionally) the non-decorated 3D files, the 2D graphic descriptions and the chosen parameters and return either a COLLADA file or a combination of a JSON description and a set of multi-dimensional textures, ready to be displayed using Web-GL. The pool is preferably elastic load balanced. One option is to make the 3D cloud engine available as a container with a Representational State Transfer (REST) Application Program Interface (API) and to create a large number of such containers using a container orchestrator like Kubernetes or AWS ECS. This way, a fast user experience is still obtainable, even as the number of concurrent users of the system increases.

Description of On-the-Fly Geometry

In many cases, geometrical information may be derived from the 2D graphics without using a predefined 3D structure (or only partially using the 3D structure). For example, the system may recognize cutting lines in the 2D representation and may be configured to emulate the process of removing from the visualization the 2D parts to be cut away in the physical process. So, for example, for a label with a complex die cut, the parts cut away by the die cutter may not be visible in the 3D representation. Similar functionality may identify and handle cutting lines representing holes in a contiguous 2D structure. As used herein, the term "hole" refers to any closed geometric shape that is cut out and removed from the surrounding sheet.

Figure 4A:
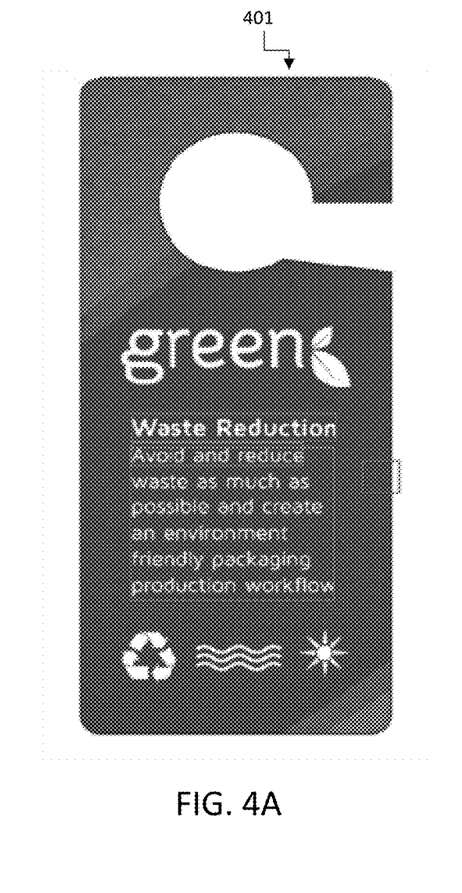
FIG. 4A is an exemplary rendering of two-dimensional graphics configured to be visualized in a three-dimensional rendering.
Figure 4B:
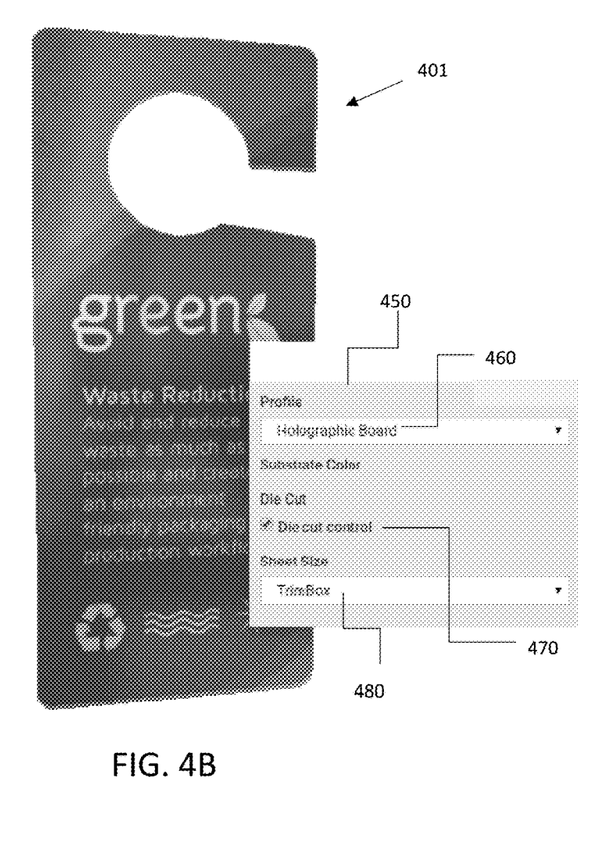
FIG. 4B is an exemplary three-dimensional rendering of the two-dimensional graphics of FIG. 4A.

In applications in which the 3D structure is very simple, such as an entirely flat or a cylindrical or conical surface, the 3D input may be replaced by a user interface configured to create such simple 3D structures "on the fly." For flat areas, this is straightforward: all areas within the cutting line create a final "card," such as the door hanger 401 as depicted in FIGS. 4A and 4B typical of those found in a hotel room.

For applications in which the 3D structure is more complex, the system may be configured to accept two graphic descriptions or a single graphic description with two pages and interpret them as a recto-verso (e.g. two printable areas for the flat structure, one for each side).

Figure 5:
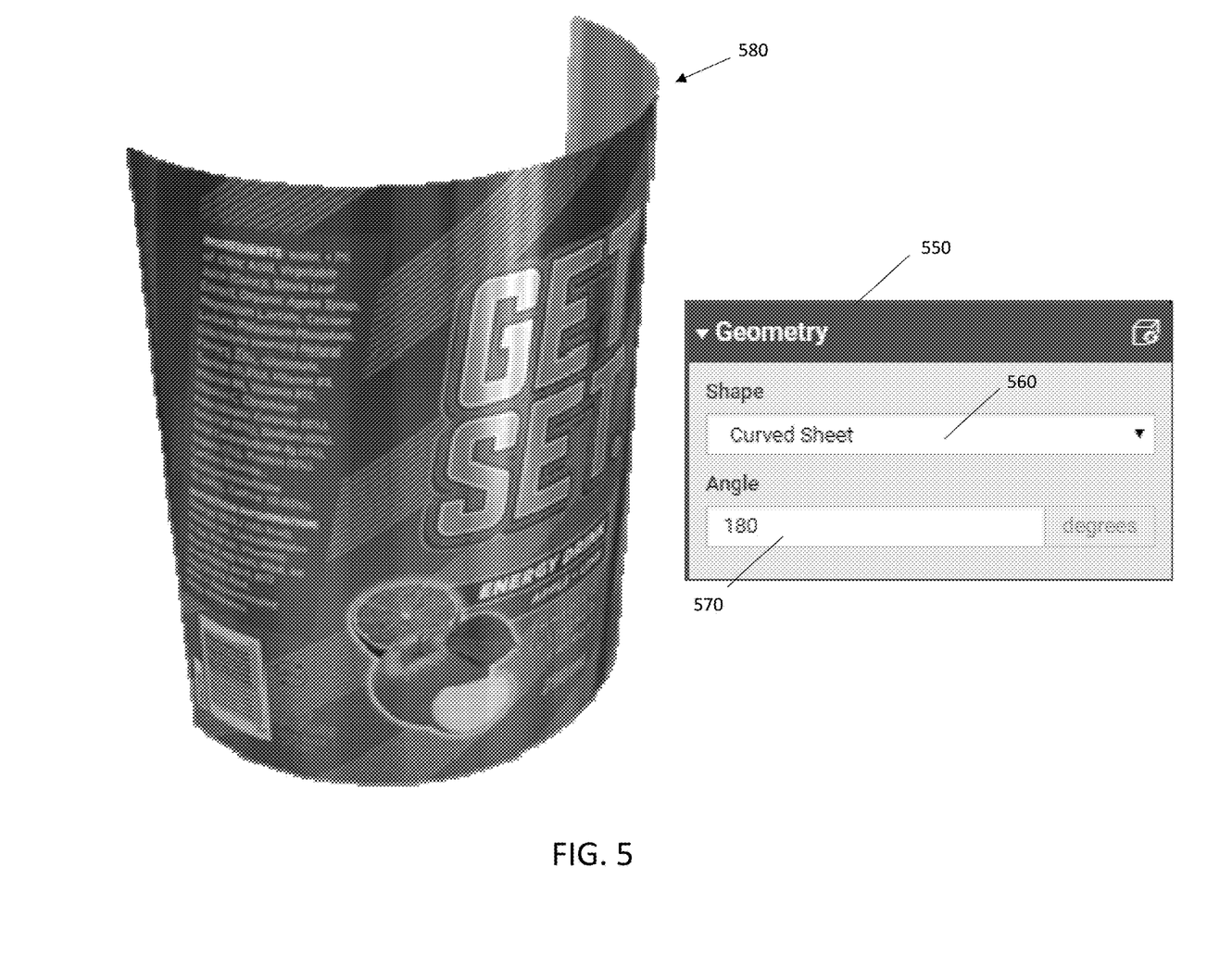
FIG. 5 is an exemplary three-dimensional rendering of a graphic object configured for placement on a curved surface.

For cylinders, the system may be configured to accept a radius or an angle covered by the width of the cut line (which for cylinders will typically, but not necessarily be rectangular). For example, as depicted in FIG. 5, the user interface may include a user interface box 550 that is configured to allow the user to choose from a menu 560 of shapes, such as "Curved Sheet," whereby subsequent choices further define that shape (e.g. menu box 570 enabling the user to select the "Angle" in radial degrees covered by the printed part). The height may be derived from the height of the graphic, and the radius from the width of the graphic and the specified angle. Cut lines corresponding to the height and width may be interpreted from the relevant separation. As depicted in FIG. 5, the resulting cylindrical graphic 380 may be depicted standing alone, or optionally, the cylinder itself may be shown in part as a simplified 2D structure, e.g. with a colored glass texture provided to fill the relevant portions above, below, and behind the graphics depicted in FIG. 5.

For truncated or non-truncated cones, the system may be configured to accept two radii (one of which is 0 for a non-truncated cone) and a height. The radii may be derivable from the 2D shape, as the top and bottom typically show the curvature.

The 3D shapes of tubes, spiral wraps, cups and flexible bags may also be derived from 2D designs with little or no user intervention. For objects of revolution, only a line and an axis may be needed to design the 3D object. This can be integrated as a separate function in the web application, or uploaded as an additional graphic (e.g. designed in Adobe Illustrator).

Folding carton shapes and corrugated carton shapes typically have associated CAD drawings. The system may be configured to automatically recognize cutting lines (typically from the "cut" separation) and creasing lines (from the "crease" separation), or it can find a CAD drawing embedded in the graphics, or an additional CAD drawing may be selected or uploaded and then aligned to the 2D graphics. Systems and methods for performing the foregoing functionality are known in the art, such as those present in WebCenter software, marketed by the Applicant of this invention. The system can then calculate the folding angles on the creases or ask the user to enter them, such that the carton can be visualized folded, or the user may be able to specify a visualization in which the box is depicted partially open to show how the flaps are opened.

Once a 3D graphic description is created on-the-fly, it can further be used in the same way as explained herein for pre-defined 3D structures, such as is depicted in FIG. 4B. As depicted in FIG. 4B, the rendering shows the door hanger card 401 with the perspective provided to the user at particular viewing angle, and the figure further shows a user interface box 450 in which the user can select the elements of the operations profile. For example, box 450 may comprise a decision menu 460 for the "Profile" from which a (preferably user-friendly or intuitive) profile can be selected, such as the "Holographic Board" profile as depicted. Additionally, the user interface box 450 contains a check box interface 470 labeled "Die cut control," depicted as checked, and then a "Sheet Size" decision menu 480 from which the choice "TrimBox" has been selected. On-the-fly 3D structures will typically have one printable area covering the entire structure, but this is not a limitation, as embodiments of the system may be configured to allow the 3D structure to extend beyond the boundaries of the 2D graphic (e.g. to show the label on a cylindrical part of a glass bottle, without necessarily showing the entire bottle).

Defining Printable Parts/Areas within the Web Application

As described herein, a basic embodiment is configured to read 3D structures with printable parts/areas from a database to which information relating to the structures was previously uploaded as files. These files may be created using a dedicated desktop application, such as Esko Studio Designer.

In another embodiment, the printable parts or areas may be defined by user input provided within the web application. This functionality may be especially fruitful if the definition operation is relatively simple, such as defining a rectangular area on a 3D structure that has a cylindrical geometry (e.g. a bottle). Methods can include showing in an HTML<canvas> a 2D "unwrapping" of (part of) the 3D structure. For example, for a cylindrical part, the flat rectangle may be shown with height of the cylinder and the width the circumference of the cylinder. The web interface may permit a user to draw in 2D basic shapes (e.g. a rectangle) and show in a 3D window the result of that input. The drawing of the shape can be replaced by selecting a shape from the 2D graphic (such as the "cut" separation or the PDF TrimBox, which defines the actual page size that gets printed).

What-if Scenarios

In preferred embodiments, the invention enables stakeholders with limited 3D skills and with limited knowledge of the pro and cons of certain printing processes to make decisions about which substrates, inks, foils and other packaging decoration processes should be selected for a project, by providing visualization of those decisions. Often, cost is also an important decision criterion. Thus, embodiments of the invention facilitate a comparison of different scenarios along with the associated cost of producing a product under each scenario. In some embodiments, additional consequences, such as delivery time or restrictions to geographic delivery regions may also be provided as part of the output.

The web application is optimally therefore configured to provide a comparison user interface in which the computer screen is split into multiple (typically two) parts (e.g., horizontal, vertical, or split between multiple displays so that multiple scenarios can be viewed simultaneously side by side). The multiple scenarios typically have the same 2D graphic and 3D structure, such that the user will be able to visualize the selection of different operation stacks or operation profiles for each of the multiple renderings. The system calculates the visualization as described herein for each of the multiple selected situations (preferably performing two parallel calls to the calculation engine pool) and the multiple 3D data sets are sent back to the browser and displayed in multiple different Web-GL html <canvas> elements. Cost information, delivery information, etc. may be provided in association with each canvas. Cost may be calculated by sending information such as area coverage for inks, size of substrates, etc., to a cost calculation module. The module may also be configured to include printing quantity as part of the calculation. A cost calculation formula may be linked to the operation stack/profile, allowing the user to input or accept suggestions from the 2D graphics and return cost in a chosen currency.

Cost Calculation Example:

A profile defining "water-based inks on flexo poly-ethylene substrate" may be compared, for example, with a profile defining "digital printing on Hewlett Packard Indigo flexible substrate."

Exemplary cost formulas may conform to the calculations provided in Equations 1 and 2, respectively:

$$\text{Plate-cost(plate-surface)} + \text{press-start-cost(flexo)} + (\text{PE-SubstrateCost(printed-area)} + \text{SUM}_i(\text{cost-water-ink}_i \times \text{coverage}_i)) \times \text{quantity} \quad (1)$$

$$\text{Press-start-cost(digital)} + (\text{Dig italSubstrateCost} \\ (\text{printed-area}) + \text{SUM}_i(\text{cost-digital-ink}_i \times \text{coverage}_i)) \times \text{quantity} \quad (2)$$

As is understood in the art, the calculations associated with the foregoing formulae will lead to different results for each of the two scenarios. Although this comparison has value on its own and exists already in other systems (e.g. in MIS or ERP systems), embodiments of the present invention provide the capability to view a rendering of the visual appearance associated with each cost calculation. Especially for decision makers not as familiar with the various results produced by print processes, embodiments of the invention providing such functionality can bring these visualizations to life in a way that cannot be reasonably captured by the sterile analysis of numbers.

Similar what-if scenarios may be used for comparing the effect of foils versus inks (e.g. using gold foil as compared to conventional and digital gold-simulating inks) or comparing a premium substrate with a cheaper substrate.

Creative design of the user interface may further improve the what-if experience for the user, e.g. by synchronizing the navigation (pan, zoom, rotate) between the 2 compare windows or by overlapping them or by creating still images which are printed out on high resolution, and the like.

Cascading what-if choices may be provided in which the evaluation of new choices may be made dependent on previous decisions. Again, while presenting information in such a way is known generally in the field for making print process choices, the combination with visualization provides a powerful way for people at different levels in the decision making process to easily visualize the results of making such choices.

Bulk Rendering Scenarios

Multiple sets of similar graphics may exist for a given 3D structural situation. A classic example is the set of labels existing for the same jam jar. There may be hundreds, taking into account flavor variations (different fruits), regional variations, and language variations. For each, a good 3D rendering may be calculated. The application of the preferred embodiment may then be further extended with an automation function to apply decisions relating to a one member of a group in bulk to other members of the group. For example, the system may be configured to provide a list of 2D graphics comprising one graphic for each final output (which may comprise combinations of, e.g., front and back labels). A user selects one member of the group and aligns that member to the 3D structure's corresponding printable part. The system then calculates the corresponding 3D result or a 2D still image from a selected viewing angle, as explained above. The bulk rendering function may then assume for all other graphics in the group that their alignment and operations profile selection are the same, and the result for each may be calculated in bulk and saved in the database and/or made available to the user interface.

Integration with Packaging Management Systems or Digital Repositories

The proposed web solution may be integrated into other web solutions such as a packaging management system. This hosting system can default or fix choices. For example, the operations profile may be determined by earlier choices made based on process (e.g. on the actual printing order). It also may be possible to capture which visualization was chosen at the moment of an approval entered into the system. This way, not just the 2D graphic, but also the 2D graphic in combination with the operations profile choice and the 3D structure may be the context of the approval. When changes are suggested (or decided) later in the process, the workflow system can determine whether the contextual rule has been broken and, for example, enforce an additional approval process. For example, a communication may be automatically sent by the system to the approver notifying the approver that a change has been made, that what is about to be printed is not what was approved, with access to see how it will look in view of the change. Thus, for example, a decision made to change to a less expensive substrate in a late stage of the process can avoid surprising an approver who made the initial decisions at an early stage of the process.

The proposed web solution may also be integrated with a digital repository, such as that described in Published PCT Application No. WO2019/0403098, incorporated herein by reference and owned by an affiliate of the Applicant. For example, the various databases as described herein may be shared with the digital repository, and renderings depicting expected actual product visualizations may be shared with the repository for use therewith.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A computer-implemented method for visualizing printed graphics applied to at least one defined printing area or part of a three dimensional (3D) structure, the method comprising the steps of:
    a) providing a visualizer web application that is remotely accessible via a global communication network by a user operating a local application in communication with the visualizer web application, the visualizer web application having a user interface for specifying one or more parameters to be accepted for execution by a visualization rendering processor embodied by at least a first container and a second container administered by a container orchestrator;
    b) accepting in the web application an input comprising machine readable instructions for rendering the 3D structure and the at least one defined printing area or part;
    c) accepting in the web application and storing in a 2D graphics database associated with the web application at least one two-dimensional (2D) graphic description and assigning it to the at least one defined printing area or part in said 3D structure, the at least one 2D graphic description comprising a plurality of separations, each separation corresponding to a processing step;
    d) accepting in the web application at least a first operation stack and a second operation stack, defining at least one operation corresponding to each of the plurality of separations;
    e) sending from the visualizer web application a first parallel call to the first container of the visualization rendering processor, the first parallel call containing first computer readable information corresponding to the at least one defined printing area or part, the at least one 2D graphic description retrieved from the 2D graphics database, and the first operation stack, and sending from the visualizer web application a second parallel call to the second container of the visualization rendering processor, the second parallel call containing second computer readable information corresponding to the at least one defined printing area or part, the at least one 2D graphic description retrieved from the 2D graphics database, and the second operation stack;

f) calculating with the visualization rendering processor primary computer readable information corresponding to a primary set of textures including color and at least one other appearance property, by applying the 2D graphic description in accordance with the first operation stack, and calculating with the second container of the visualization rendering processor secondary computer readable information corresponding to a secondary set of textures including color and at least one other appearance property, by applying the 2D graphic description in accordance with the second operation stack;

g) sending the primary computer readable information and the secondary computer readable information to the visualizer web application; and h) providing from the visualizer web application computer readable instructions for displaying on the local application of the user a graphical image corresponding to the 3D structure with the calculated primary set of textures and the calculated secondary set of textures.

2. The method of claim 1, further comprising storing the computer readable instructions for displaying the graphical image corresponding to the 3D structure with the calculated set of textures.

3. The method of claim 1, wherein accepting the 3D structure further comprises generating the 3D structure based upon user input.

4. The method of claim 3, wherein the 3D structure is selected from a group consisting of: a flat sheet, a cylinder, a cone, or an object of revolution.

5. The method of claim 4, wherein the flat sheet comprises a sheet having at least one die cut line.

6. The method of claim 5, wherein the die cut line defines at least one hole.

7. The method of claim 1, wherein the 2D graphics are applied to an outside and an inside or a front and back of a 3D structure.

8. The method of claim 1, wherein the 2D graphics are geometrically aligned to the print area by one of top, left, bottom, right or center alignment.

9. The method of claim 1, wherein the 2D graphics are aligned to the print area by fitting a shape in the print area with a cut shape in the 2D graphics.

10. The method of claim 1, wherein the 2D graphics are aligned to the print area using inputs received from an interactive alignment tool provided by the web visualizer application user interface.

11. The method of claim 1, wherein at least one of the steps of accepting the 2D graphic description or accepting the 3D structure comprises accepting information from a digital asset management system.

12. The method of claim 1, further comprising providing from the web visualizer application interactive tools that allow a user to manipulate one or both of a disposition of the 3D structure and an environment surrounding the 3D structure.

13. The method of claim 12, wherein modifying the environment surrounding the 3D structure comprises modifying a lighting effect of the environment on the 3D structure.

14. The method of claim 12, wherein modifying the disposition of the 3D structure comprises modifying a viewing angle of the 3D structure.

15. The method of claim 12, wherein modifying the disposition of the 3D structure comprises moving one or more movable components.

16. The method of claim 1, wherein: providing the computer readable instructions for displaying the graphical image corresponding to the 3D structure with the calculated set of textures comprises:
providing a first set of the computer readable instructions for displaying the graphical image corresponding to the 3D structure with a first alternative calculated set of textures;
providing a second set of the computer readable instructions for displaying the graphical image corresponding to the 3D structure with a second alternative calculated set of textures; and
providing computer readable instructions for displaying the 3D structure with the first alternative and the 3D structure with the second alternative for viewing simultaneously.

17. The method of claim 1, comprising providing interactive shape creation tools via the visualizer web application user interface.

18. The method of claim 1, further comprising identifying a group of 2D graphic descriptions associated with a same defined printing area or part in said 3D structure, each member of the group having an operation stack identical to the first operation stack or the second operation stack corresponding to the corresponding plurality of separations, wherein the calculating step comprises calculating in bulk the modified 3D structure corresponding to each member of the group.

19. The method of claim 1, wherein the local application in communication with the visualizer web application comprises a web application running on a mobile device.

20. The method of claim 1, wherein the local application in communication with the visualizer web application comprises a web application running on a browser.

21. The method of claim 1, further comprising selecting the modified 3D structure for use in a workflow, and forwarding information corresponding to the selected modified 3D structure for use in downstream steps of the workflow.

22. The method of claim 1, wherein the container orchestrator is elastically balanced.

23. The method of claim 1, wherein accepting the first operation stack comprises selecting an operation profile and generating the first operation stack according to the rules defined in the Operation Profile.

24. The method of claim 23, wherein:
the web application includes a cost calculation module; and the method further comprises steps of:
i) providing from the cost calculation module a first set of computer readable costing instructions corresponding to the first alternative set of textures; and
j) providing from the cost calculation module a second set of computer readable costing instructions corresponding to the second alternative set of textures.

25. A system for visualizing printed graphics applied to at least one defined printing area or part of a three dimensional (3D) structure, the system comprising:
at least one computer processor accessible via a global communication network, the at least one computer processor programmed with computer readable instructions for providing:
a visualization rendering processor embodied by at least a first container and a second container administered by a container orchestrator;

a visualizer web application remotely accessible from a local application in communication with the visualizer web application, the visualizer web application having a user interface for specifying one or more parameters to be accepted for execution by the visualization rendering processor, the visualizer web application programmed with instructions for:

accepting in the web application machine readable instructions for rendering the 3D structure with the at least one defined printing area or part;

accepting in the web application at least one two-dimensional (2D) graphic description and assigning it to the at least one printing area or part in said 3D structure, the at least one 2D graphic description comprising a plurality of separations, each separation corresponding to a processing step;

accepting in the web application at least a first operation stack and a second operation stack, defining at least one operation corresponding to each of the plurality of separations;

sending a first parallel call to the first container, the first parallel call containing first computer readable information corresponding to the 3D structure, the at least one defined printing area or part, the at least one 2D graphic description, and the first operation stack, to the visualization rendering processor, and sending a second parallel call to the second container, the second parallel call containing second computer readable information corresponding to the 3D structure, the at least one defined printing area or part, the at least one 2D graphic description, and a second operation stack;

providing primary computer readable instructions for displaying on a local application of a user a graphical image corresponding to the 3D structure with a primary set of textures, including color and at least one other appearance property, calculated by the visualization rendering processor, and providing secondary computer readable instructions for displaying on the local application of the user a graphical image corresponding to the 3D structure with a secondary set of textures, including color and at least one other appearance property, calculated by the second container of the visualization rendering processor;

the visualization rendering processor programmed with instructions for calculating primary computer readable information corresponding to the primary set of textures by applying the 2D graphic description in accordance with the first operation stack and for sending the calculated primary set of textures to the visualizer web application, and instructions for calculating secondary computer readable information corresponding to the secondary set of textures by applying the 2D graphic description in accordance with the second operation stack and for sending the calculated secondary set of textures to the visualizer web application.

26. The system of claim 25, further comprising at least one device having a display and a resident application comprising computer readable instructions for communicating over the global communication network with the at least one computer processor comprising the visualization rendering processor and the visualizer web application, the at least one device configured to display the 3D structure with the calculated set of textures on the display.

27. A computer-implemented method for visualizing printed graphics applied to at least one defined printing area or part of a three dimensional (3D) structure, the method comprising the steps of:

a) providing a local application configured for communication with a user interface of a remotely accessible visualizer web application via a global communication network, the visualizer web application user interface configured to specify one or more parameters to be accepted for execution by a visualization rendering processor embodied by at least a first container and a second container administered by a container orchestrator, the local application configured to enable the user to:

i. specify to the web application machine readable instructions for rendering the 3D structure with the at least one defined printing area or part;

ii. specify to the web application at least one two-dimensional (2D) graphic description and assign it to the at least one printing area or part in said 3D structure, the at least one 2D graphic description comprising a plurality of separations, each separation corresponding to a processing step;

iii. specify to the web application at least a first operation stack and a second operation stack, each defining at least one operation corresponding to each of the plurality of separations; and iv. receive from the web application computer readable instructions for displaying a graphical image corresponding to the 3D structure with a primary set of textures;

wherein:

the web application is configured to:
store in a 2D graphics database the at least one 2D graphics description; and
send a first parallel call to the first container of the visualization rendering processor, the first parallel call containing first computer readable information corresponding to the at least one defined printing area or part, the at least one 2D graphic description retrieved from the 2D graphics database, and the first operation stack, and sending from the web application a second parallel call to the second container of the visualization rendering processor, the second parallel call containing second computer readable information corresponding to the at least one defined printing area or part, the at least one 2D graphic description retrieved from the 2D graphics database, and the second operation stack; and the visualization rendering processor is configured to:
calculate primary computer readable information corresponding to the primary set of textures including color and at least one other appearance property, by applying the 2D graphic description in accordance with the first operation stack, and calculating with the second container of the visualization rendering processor secondary computer readable information corresponding to the secondary set of textures including color and at least one other appearance property, by applying the 2D graphic description in accordance with the second operation stack; and
send the primary computer readable information and the secondary computer readable information to the web application.

28. Non-transitory computer-readable media comprising computer-readable instructions for visualizing printed graphics applied to at least one defined print area of a three dimensional (3D) structure, the instructions programmed to provide:

a visualizer web application remotely accessible via a global communication network via a user operating a local application in communication with the visualizer web application, the visualizer web application having a user interface for specifying one or more parameters to be accepted for execution by a visualization rendering processor embodied by at least a first container and a second container administered by a container orchestrator, the visualizer web application programmed to:
accept machine readable instructions for rendering the 3D structure with the at least one defined printing area or part;
accept at least one two-dimensional (2D) graphic description, storing it in a 2D graphics database associated with the web application, and assigning it to the at least one printing area or part in said 3D structure, the at least one 2D graphic description comprising a plurality of separations, each separation corresponding to a print processing step;
accept at least a first operation stack and a second operation stack of at least two operation stacks defining at least one operation corresponding to each of the plurality of separations;
send a first parallel call to the first container of the visualization rendering processor, the first parallel call containing first computer readable information corresponding to the 3D structure, the at least one defined printing area or part, the at least one 2D graphic description retrieved from the 2D graphics database, and the first operation stack, and sending a second parallel call to the second container of the visualization rendering processor, the second parallel call containing second computer readable information corresponding to the at least one defined printing area or part, the at least one 2D graphic description retrieved from the 2D graphics database, and the second operation stack;
receive primary computer readable information and secondary computer readable information corresponding to the 3D structure with a primary set of textures and a secondary set of textures calculated by the visualization rendering processor; and
provide computer readable instructions for displaying a graphical image corresponding to the 3D structure with the calculated primary set of textures and the calculated secondary set of textures on the local application;
wherein the visualization rendering processor is configured to:
calculate the primary computer readable information corresponding to the primary set of textures including color and at least one other appearance property, by applying the 2D graphic description in accordance with the first operation stack, and calculate with the second container of the visualization rendering processor the secondary computer readable information corresponding to the secondary set of textures including color and at least one other appearance property, by applying the 2D graphic description in accordance with the second operation stack; and
send the primary computer readable information and the secondary computer readable information to the web application.

29. Non-transitory computer-readable media comprising computer-readable instructions for visualizing printed graphics applied to at least one defined print area of a three dimensional (3D) structure, the instructions programmed to provide:
a local application configured for communication with a user interface of a remotely accessible visualizer web application via a global communication network, the visualizer web application user interface configured to specify one or more parameters to be accepted for execution by a visualization rendering processor embodied by at least a first container and a second container administered by a container orchestrator, the local application configured to enable the user to:
specify to the web application machine readable instructions for rendering the 3D structure with the at least one defined printing area or part;
specify to the web application at least one two-dimensional (2D) graphic description and assign it to the at least one printing area or part in said 3D structure, the at least one 2D graphic description comprising a plurality of separations, each separation corresponding to a print processing step;
specify to the web application at least a first operation stack and a second operation stack of at least two operation stacks, each defining at least one operation corresponding to each of the plurality of separations; and
receive from the web application computer readable instructions for displaying a graphical image corresponding to the 3D structure with a primary set of textures and a secondary set of textures;
wherein:
the web application is configured to:
store in a 2D graphics database the at least one 2D graphics description; and
send a first parallel call to the first container of the visualization rendering processor, the first parallel call containing first computer readable information corresponding to the at least one defined printing area or part, the at least one 2D graphic description retrieved from the 2D graphics database, and the first operation stack, and sending from the web application a second parallel call to the second container of the visualization rendering processor, the second parallel call containing second computer readable information corresponding to the at least one defined printing area or part, the at least one 2D graphic description retrieved from the 2D graphics database, and the second operation stack; and
the visualization rendering processor is configured to:
calculate primary computer readable information corresponding to the primary set of textures including color and at least one other appearance property, by applying the 2D graphic description in accordance with the first operation stack, and calculating with the second container of the visualization rendering processor secondary computer readable information corresponding to the secondary set of textures including color and at least one other appearance property, by applying the 2D graphic description in accordance with the second operation stack; and
send the primary computer readable information and the secondary computer readable information to the web application.

\* \* \* \* \*